US008767391B2

(12) United States Patent
Jin et al.

(10) Patent No.: US 8,767,391 B2
(45) Date of Patent: Jul. 1, 2014

(54) CHASSIS WITH ADJUSTABLE BAFFLE FOR COOLING

(75) Inventors: Youlin Jin, Santa Clara, CA (US); Jiye Xu, Santa Clara, CA (US); Vadim Gektin, San Jose, CA (US)

(73) Assignee: Futurewei Technologies, Inc., Plano, TX (US)

( * ) Notice: Subject to any disclaimer, the term of this patent is extended or adjusted under 35 U.S.C. 154(b) by 135 days.

(21) Appl. No.: 13/595,777

(22) Filed: Aug. 27, 2012

(65) Prior Publication Data

US 2014/0055951 A1 Feb. 27, 2014

(51) Int. Cl.
*H05K 7/20* (2006.01)
*A47B 77/08* (2006.01)
*H05K 5/00* (2006.01)

(52) U.S. Cl.
USPC ....... 361/679.51; 454/184; 312/236; 361/695

(58) Field of Classification Search
CPC .......... G06F 1/16–1/1654; G06F 1/1656; G06F 1/1662–1/1681; G06F 1/1684–1/189; G06F 1/20; G06F 1/203; G06F 1/206; G06F 2200/201; G06F 2200/202; G06F 2200/203; H05K 5/00; H05K 5/0026; H05K 5/0082; H05K 5/0021; H05K 5/0086–5/06; H05K 5/069; H05K 7/005–7/08; H05K 7/20; H05K 7/00; H05K 7/1422; H05K 1/0218–1/0219; H05K 1/00; H05K 3/00; H05K 9/00; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00; H01K 1/00; H01K 3/00; H02B 1/00; H01H 37/00
USPC ............... 361/679.46–679.54, 688–723, 802; 454/184; 312/236; 225/103
See application file for complete search history.

(56) References Cited

U.S. PATENT DOCUMENTS 5,731,952 A * 3/1998 Ohgami et al. .......... 361/679.47
6,018,458 A * 1/2000 Delia et al. .................... 361/690

(Continued)

FOREIGN PATENT DOCUMENTS

| CN | 102111986 | 6/2011 |
| CN | 102638957 | 8/2012 |

(Continued)

OTHER PUBLICATIONS

International Search Report issued in International Application No. PCT/CN2013/082392, dated Dec. 12, 2013, 11 pages.

*Primary Examiner* — Zachary M Pape
*Assistant Examiner* — Razmeen Gafur
(74) *Attorney, Agent, or Firm* — Slater & Matsil, L.L.P.

(57) ABSTRACT

A chassis including a slot configured to receive a printed circuit board having a baffle position pin and electronic components mounted thereon, a guide mechanism mounted within the slot, and a carriage moveably mounted within the slot and biased toward a slot opening by the guide mechanism, the carriage including a baffle suitable to manipulate a flow of air through the slot, the carriage configured to be driven away from the slot opening and to be oriented relative to the electronic components on the printed circuit board by the baffle position pin when the printed circuit board is loaded into the slot such that the baffle directs the flow of air over the electronic components.

23 Claims, 3 Drawing Sheets

(56) References Cited

U.S. PATENT DOCUMENTS

| | | | |
|---|---|---|---|
| 6,566,859 B2* | 5/2003 | Wolski et al. | 324/754.08 |
| 7,215,556 B2* | 5/2007 | Wrycraft | 361/802 |
| 7,423,872 B2* | 9/2008 | Chen | 361/695 |
| 7,474,528 B1* | 1/2009 | Olesiewicz et al. | 361/695 |
| 7,755,902 B2* | 7/2010 | Peng et al. | 361/719 |
| 2005/0286223 A1* | 12/2005 | Morales | 361/690 |
| 2008/0094799 A1 | 4/2008 | Zieman et al. | |
| 2008/0101016 A1* | 5/2008 | Brooks et al. | 361/690 |
| 2010/0182749 A1* | 7/2010 | Su | 361/695 |
| 2011/0157822 A1 | 6/2011 | Wu et al. | |
| 2013/0329362 A1 | 12/2013 | Huang et al. | |

FOREIGN PATENT DOCUMENTS

| | | |
|---|---|---|
| JP | H11103185 | 4/1999 |
| JP | 2009111232 | 5/2009 |

\* cited by examiner

CHASSIS WITH ADJUSTABLE BAFFLE FOR COOLING

TECHNICAL FIELD

The present disclosure relates to a chassis for holding printed circuit boards (PCBs) and, in particular, to a chassis having adjustable baffles configured to manipulate an airflow through the chassis to sufficiently cool electronic components mounted on the PCBs stored therein.

BACKGROUND

A conventional air-cooled chassis may include one or more internal baffles. These baffles are used to direct a cooling flow of air over electronic components mounted on PCBs stored therein.

Unfortunately, the baffles found in conventional air-cooled chassis are often fixed in place. These stationary baffles cannot be moved or adjusted to accommodate PCBs that have different electronic component layouts. As such, the baffles are generally unable to direct the flow of air over the electronic components mounted on the PCBs in the chassis to provide sufficient or optimal cooling.

SUMMARY

An embodiment chassis includes a slot configured to receive a printed circuit board having a baffle position pin and electronic components mounted thereon, a guide mechanism mounted within the slot, and a carriage moveably mounted within the slot and biased toward a slot opening by the guide mechanism, the carriage including a baffle suitable to manipulate a flow of air through the slot, the carriage configured to be driven away from the slot opening and to be oriented relative to the electronic components on the printed circuit board by the baffle position pin when the printed circuit board is loaded into the slot such that the baffle directs the flow of air over the electronic components.

An embodiment loaded chassis includes a printed circuit board having a baffle position pin and electronic components mounted thereon, a slot configured to receive the printed circuit board, a guide mechanism mounted within the slot, and a carriage moveably mounted within the slot and biased toward a slot opening by the guide mechanism, the carriage including a baffle suitable to manipulate a flow of air through the slot, the carriage driven away from the slot opening and oriented relative to the electronic components on the printed circuit board by the baffle position pin when the printed circuit board is loaded into the slot such that the baffle directs the flow of air over the electronic components.

An embodiment method of cooling electronic components includes forming a slot configured to receive a printed circuit board having a baffle position pin and electronic components mounted thereon, mounting a guide mechanism within the slot, biasing a carriage moveably mounted within the slot toward a slot opening with the guide mechanism, the carriage including a baffle suitable to manipulate a flow of air through the slot, and driving the carriage away from the slot opening and orienting the carriage relative to the electronic components on the printed circuit board using the baffle position pin when the printed circuit board is loaded into the slot such that the baffle of the carriage directs the flow of air over the electronic components.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a chassis for receiving and storing printed circuit boards (PCBs). The concepts in the disclosure may also apply, however, to other hardware or devices.

Figure 1:
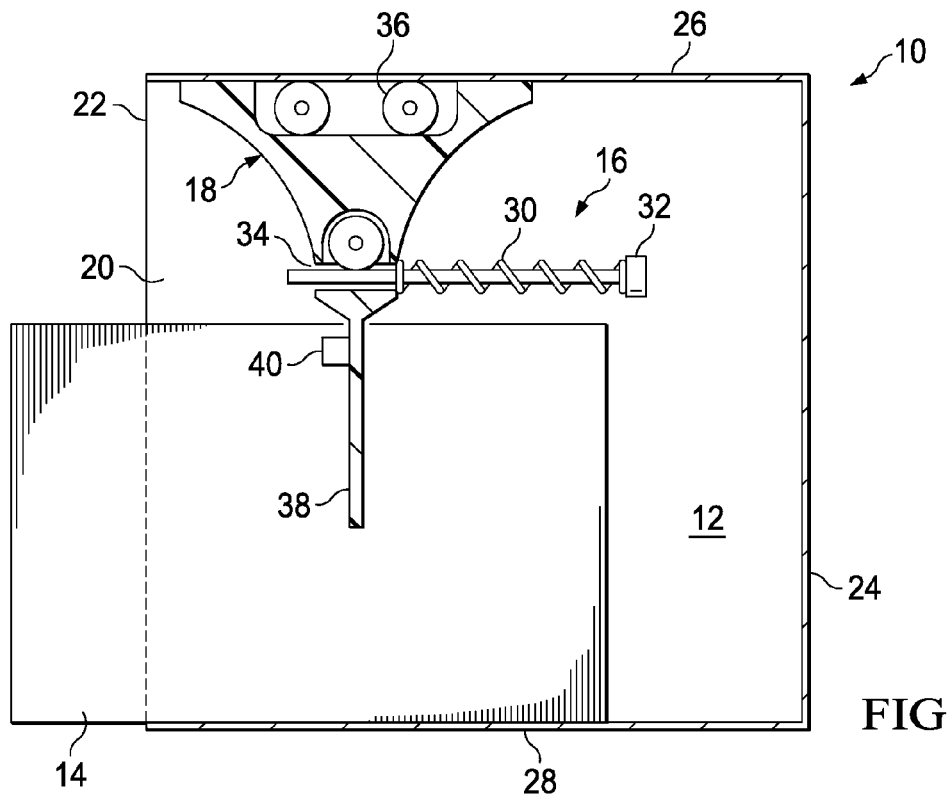
FIG. 1 illustrates in cross section an embodiment chassis, which includes a guide mechanism biasing a carriage with a baffle, receiving a printed circuit board with a baffle position pin.

Referring now to FIG. 1, an embodiment chassis 10 is illustrated. As will be more fully explained below, the chassis 10 generally includes a slot 12 configured to receive a printed circuit board 14, a guide mechanism 16 mounted within the slot 12, and a carriage 18 moveably mounted within the slot 12. As shown in FIG. 1, in an embodiment the printed circuit board 14 is loaded into the slot 12 through a slot opening 20 formed within a front side 22 of the chassis 10. Even so, in other embodiments the slot opening 20 may be located in, for example, a back side 24, a top 26, or a bottom 28 of the chassis 10.

Still referring to FIG. 1, the guide mechanism 16 is configured to bias the carriage 18 toward the slot opening 20. In that regard, the guide mechanism 16 may be suitably formed from a variety of bias producing devices or mechanisms. In an embodiment, the guide mechanism 16 comprises a spring 30 mounted around a guide pole 32. As shown, the guide pole 32 passes through a passage 34 in the carriage 18. As such, the spring 30 is compressible between the carriage 18 and a stop end of the guide pole 32 to bias the carriage 18 toward the slot opening 20 of the slot 12.

The carriage 18 is moveably mounted within the slot 12. In an embodiment, the carriage 18 is configured to move laterally or horizontally within the slot 12. In other words, the carriage 18 is able to move back and forth between the front side 22 and the back side 24 of the chassis 10. Even so, it is contemplated that the carriage 18 may be able to move in other directions in other embodiments. As shown in FIG. 1, in an embodiment the carriage 18 includes a plurality of wheels 36. One or more of the wheels 36 may be used to move the carriage 18 relative to the body of the chassis 10. In addition, one or more of the wheels 36 may be located adjacent the passage 34 extending through the carriage 18 and engage the guide pole 32 of the guide mechanism 16.

Still referring to FIG. 1, the carriage 18 includes a baffle 38 (a.k.a., a chassis baffle). In an embodiment, the baffle 38 projects down toward the bottom 28 of the chassis 10. In such a configuration, the baffle 38 is generally orthogonal to the top 26 of the chassis 10. Even so, the baffle 38 may be otherwise oriented. For example, the baffle 38 may be angled toward either the front side 22 or the back side 24 of the chassis 10. In addition, despite the baffle 38 being illustrated as straight in FIG. 1, the baffle 38 may be curved in an embodiment. Moreover, the baffle 38 may have a variety of suitable dimensions (e.g., length, width, and thicknesses) depending on one or more factors such as, for example, the size and/or configuration of the printed circuit board 14 and components mounted thereon, the desired airflow path, and so on. In an embodiment, the baffle 38 may be formed from an air permeable material (e.g., foam) or include one or more apertures in order to permit some portion of air to pass through the baffle 38 instead of around it.

Figure 2:
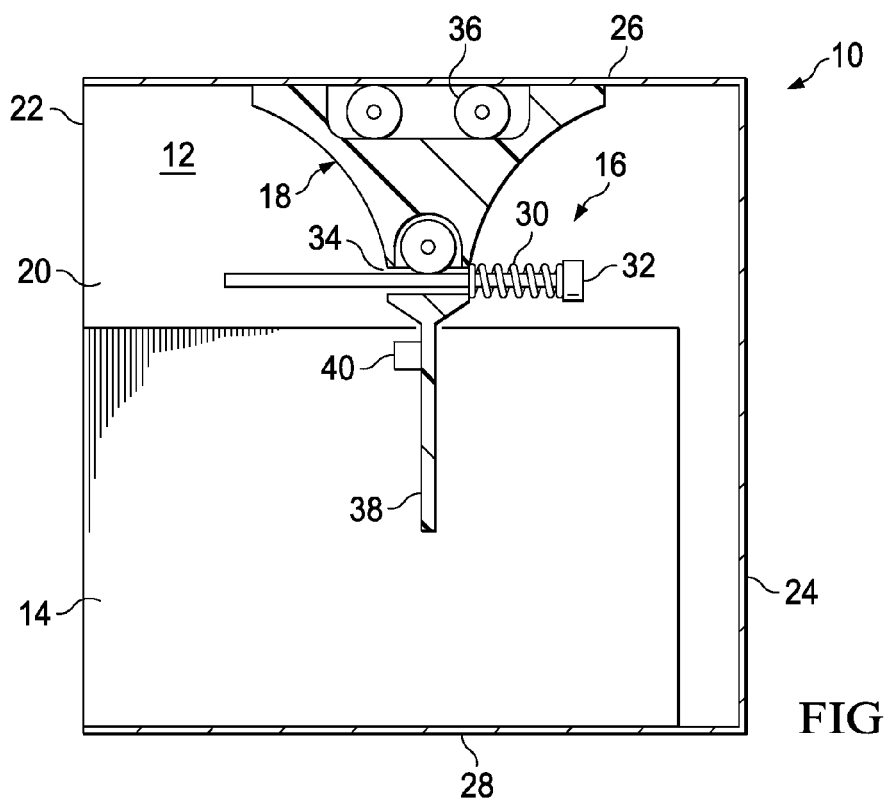
FIG. 2 illustrates in cross section the chassis of FIG. 1 after the printed circuit board is loaded therein.

Referring collectively to FIGS. 1-2, the carriage 18 is driven away from the slot opening 20 by a baffle position pin 40 of the printed circuit board 14 when the printed circuit board is loaded into the slot 12. In other words, the baffle position pin 40 moves the carriage 18 from an initial position (FIG. 1) to a final position (FIG. 2) during loading of the printed circuit board 14. As shown in FIG. 2, when the carriage 18 is disposed in the final position, the spring 30 from the guide mechanism 16 is significantly compressed between the carriage 18 and the stop end of the guide pole 32. In an embodiment, a releasable latch mechanism (not shown) may be employed to retain the printed circuit board 14 within in the chassis 10 and/or maintain the carriage 18 in the final position of FIG. 2.

Figure 3:
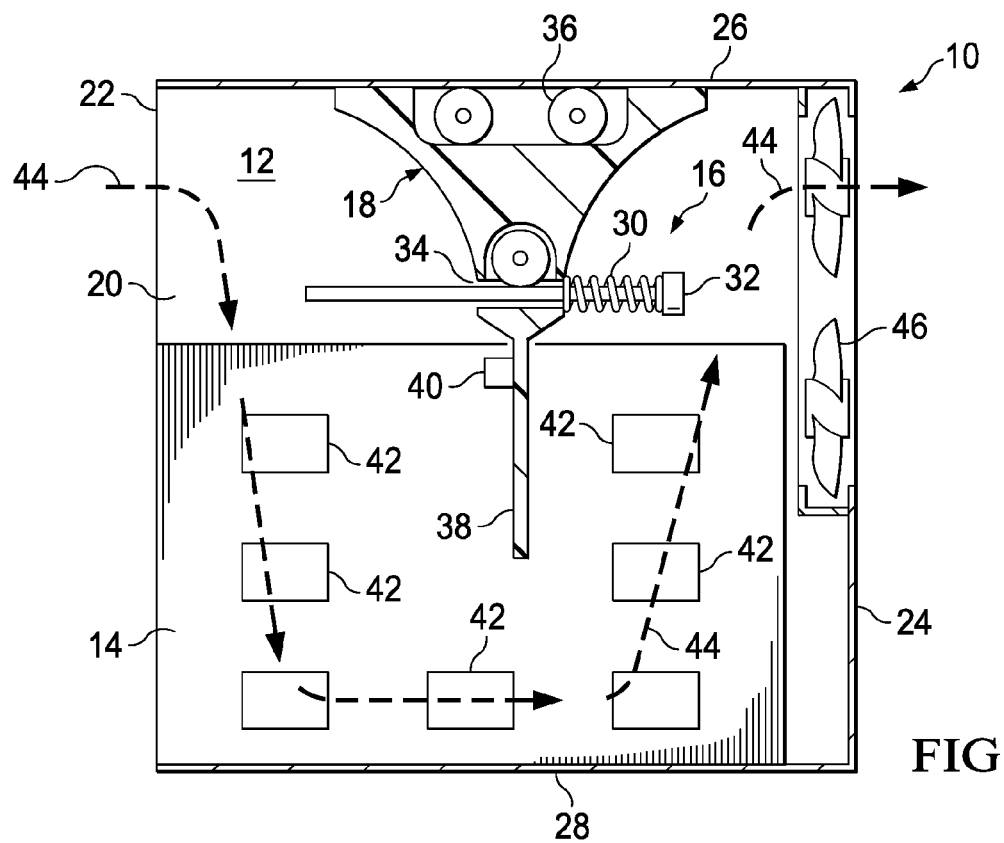
FIG. 3 illustrates in cross section the loaded chassis of FIG. 2 wherein the baffle directs a flow of air over the electronic components on the printed circuit board.

Referring now to FIG. 3, the printed circuit board 14 includes one or more electronic components 42 mounted thereon. The electronic components 42 may be, for example, chips, die, passive or active devices, or other electric components employed on a printed circuit board.

Notably, the baffle position pin 40 is located on the printed circuit board 14 with consideration for the layout of the electronic components. As such, the baffle position pin 40 ensures that the baffle 38, which is able to manipulate or otherwise direct a flow of air 44 through the slot 12, is disposed at the position that assures the most beneficial airflow through the slot 12 when the printed circuit board 14 is loaded in the chassis 10 as shown in FIG. 3. In other words, the baffle 38 of the carriage 18 is oriented relative to the electronic components 42 on the printed circuit board 14 by the baffle position pin 40 to optimize or maximize the cooling benefit of the flow of air 44 through the slot 12. Therefore, the electronic components 42 of the printed circuit board 14 are sufficiently cooled by the flow of air 44.

In an embodiment, the baffle position pin 40 is located proximate a top of the printed circuit board 14 as oriented in FIG. 3. Even so, in an embodiment the baffle position pin 40 may be disposed at other locations on the printed circuit board 14. In addition, in an embodiment the baffle position pin 40 may be replaced by another type of engagement mechanism such as, for example, a salient, detent, wedge, slot receiving a pin, and so on. Indeed, the use of a pin and the component used to drive the carriage 18 is not intended to be limiting.

As shown in FIG. 3, in an embodiment an airflow generating mechanism 46 in fluid communication with the slot 12. The airflow generating mechanism 46 is operable to generate the flow of air 44 through the slot 12. In an embodiment, the airflow generating mechanism 46 is an exhaust fan or a plurality of exhaust fans.

Figure 4:
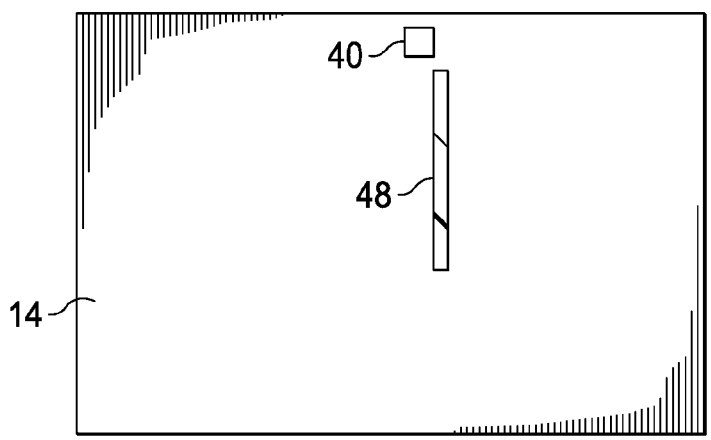
FIG. 4 illustrates in side elevation view an embodiment printed circuit board configured to be loaded in the chassis of FIG. 1, the printed circuit board including the baffle locator pin and a fixed baffle.

Moving now to FIG. 4, in an embodiment the printed circuit board 14 includes a fixed baffle 48 proximate the baffle position pin 40. The fixed baffle 48 is configured to cooperate with the baffle 38 of the carriage 18 in order to manipulate the flow of air 44 through the slot 12. In other words, the fixed baffle 48 of the printed circuit board 14 and the baffle 38 of the carriage 18 may work together to direct the flow of air 44 over and cool the electronic components 42. It should be appreciated the fixed baffle 48 may have a variety of different dimensions, be at a different dimensions or angles, and so on depending on the configuration of the electronic components 42 on the printed circuit board 14 (FIG. 3). In an embodiment, the fixed baffle 48 extends to the top of the printed circuit board 14 and, as such, a relatively short baffle 38 (or no baffle 38 at all) may be used to direct the flow of air 44 the electronic components 42.

Figure 5:
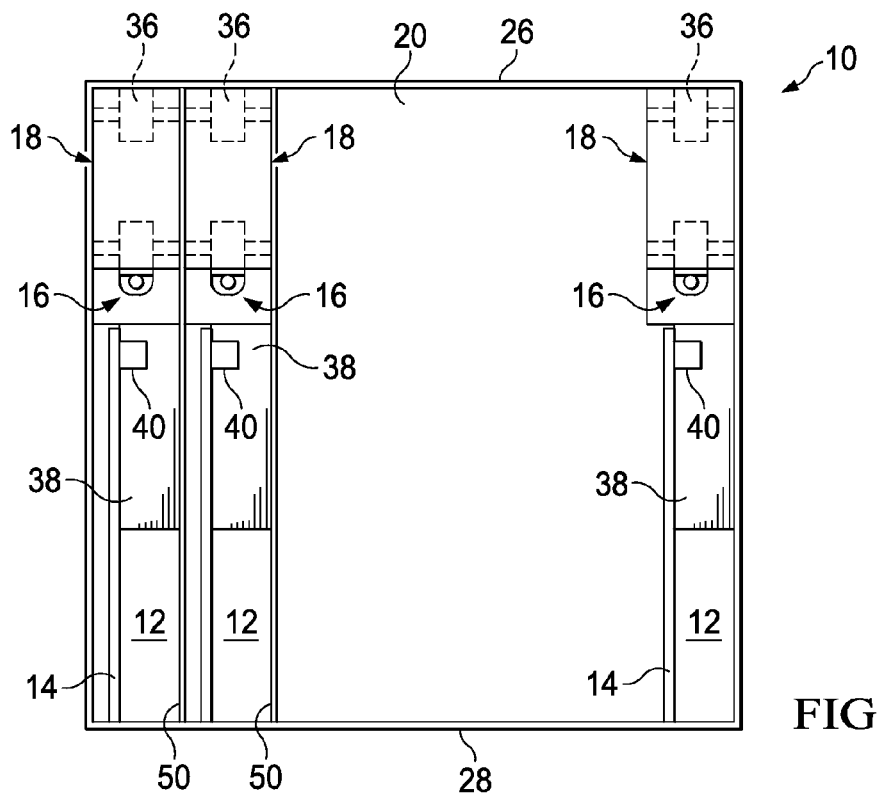
FIG. 5 illustrates in front elevation view the chassis of FIG. 2 illustrating a plurality of slots.

As shown in FIG. 5, the chassis may include a plurality of the slots 12 illustrated in FIG. 1-3. In an embodiment, the slots 12 are horizontally adjacent to one another. Even so, in other embodiments the slots 12 may be vertically adjacent to each other or otherwise oriented within the chassis 10. In an embodiment, a boundary of one or more of the slots 12 is defined by a divider 50 (e.g., a clapboard) within the chassis 10. The divider 50 generally ensures that the flow of air 44 in each slot 12 is generally unaffected by airflows in neighboring slots 12. In other words, the divider discourages the flow of air 44 in one slot 12 from disrupting or adversely affecting the flow of air in an adjacent slot 12.

Figure 6:
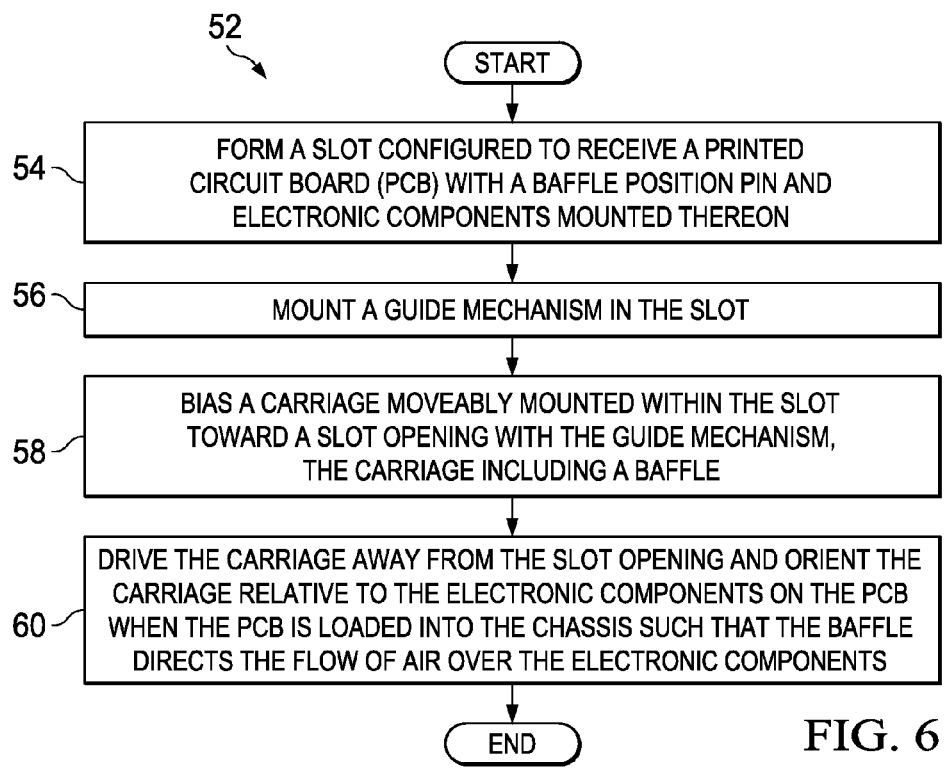
FIG. 6 illustrates a method of cooling electronic components using the chassis of FIG. 2.

Referring now to FIG. 6, a method 52 of cooling the electronic components 42 is illustrated. In block 54, a slot configured to receive a printed circuit board having a baffle position pin and electronic components mounted thereon is formed. In block 56, the guide mechanism 16 is mounted within the slot 12. Next, in block 58, the carriage moveably mounted within the slot 12 is biased toward the slot opening 20 with the guide mechanism. The baffle 38 of the carriage 18 is suitable to manipulate the flow of air through the slot 12. Thereafter, in block 60, the carriage 18 is driven away from the slot opening 20 and the carriage is oriented relative to the electronic components 42 on the printed circuit board 14 using the baffle position pin 40 when the printed circuit board 14 is loaded into the slot 12. As such, the baffle 38 of the carriage 18 directs the flow of air 44 over the electronic components 42.

From the foregoing, it should be recognized that the adjustable baffle 38 of the carriage 18 allows for diverse printed circuit board layouts. Therefore, multiple printed circuit board types are useable in a single chassis. Moreover, the automatic adjustment of the position of the baffle 38 makes insertion of the printed circuit board easier and prevents potential baffle placement mistakes. In addition, precise baffle 38 placement for each of the printed circuit boards 14 loaded into the chassis improves cooling efficiency, which in turn reduces overall system power requirements.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A chassis, comprising:
   a slot configured to receive a printed circuit board having a baffle position pin and electronic components mounted thereon;
   a guide mechanism mounted within the slot; and
   a carriage moveably mounted within the slot and biased toward a slot opening by the guide mechanism, the carriage including a baffle suitable to manipulate a flow of air through the slot, the carriage configured to be driven away from the slot opening and to be oriented relative to the electronic components on the printed circuit board by the baffle position pin when the printed circuit board is loaded into the slot such that the baffle directs the flow of air over the electronic components.

2. The chassis of claim 1, wherein the carriage is moveably mounted within the slot using a plurality of wheels.

3. The chassis of claim 1, wherein the carriage is configured to move laterally within the slot.

4. The chassis of claim 1, wherein the baffle depends downwardly from the carriage.

5. The chassis of claim 1, wherein the baffle is formed from a material permeable to air.

6. The chassis of claim 1, wherein the baffle includes at least one aperture configured to permit the flow of air to pass through the baffle.

7. The chassis of claim 1, wherein the guide mechanism comprises a spring mounted around a guide pole.

8. The chassis of claim 7, wherein the guide pole passes through a passage formed in the carriage.

9. The chassis of claim 1, wherein the slot is at least partially defined by a divider.

10. The chassis of claim 1, wherein the slot is adjacent to a plurality of additional slots.

11. The chassis of claim 1, further comprising an airflow generating mechanism in fluid communication with the slot, the airflow generating mechanism operable to generate the flow of air through the slot.

12. The chassis of claim 11, wherein the airflow generating mechanism is an exhaust fan.

13. A loaded chassis, comprising:
   a printed circuit board having a baffle position pin and electronic components mounted thereon;
   a slot configured to receive the printed circuit board;
   a guide mechanism mounted within the slot; and
   a carriage moveably mounted within the slot and biased toward a slot opening by the guide mechanism, the carriage including a baffle suitable to manipulate a flow of air through the slot, the carriage driven away from the slot opening and oriented relative to the electronic components on the printed circuit board by the baffle position pin when the printed circuit board is loaded into the slot such that the baffle directs the flow of air over the electronic components.

14. The loaded chassis of claim 13, wherein the carriage is moveably mounted within the slot using a plurality of wheels.

15. The loaded chassis of claim 13, wherein the carriage is configured to move laterally within the slot and the baffle depends downwardly from the carriage.

16. The loaded chassis of claim 13, wherein the guide mechanism comprises a spring mounted around a guide pole.

17. The loaded chassis of claim 13, further comprising an exhaust fan in fluid communication with the slot, the exhaust fan producing the flow of air.

18. The loaded chassis of claim 13, wherein the slot is horizontally adjacent to a plurality of additional slots.

19. The loaded chassis of claim 13, wherein the baffle position pin is disposed proximate a top of the printed circuit board.

20. The loaded chassis of claim 13, wherein the printed circuit board includes a fixed baffle, the fixed baffle configured to cooperate with the baffle of the carriage to direct the flow of air over the electronic components.

21. The loaded chassis of claim 20, wherein a length of the fixed baffle is greater than a length of the baffle of the carriage.

22. A method of cooling electronic components, comprising:
   forming a slot configured to receive a printed circuit board with a baffle position pin and electronic components mounted thereon;
   mounting a guide mechanism within the slot;
   biasing a carriage moveably mounted within the slot toward a slot opening with the guide mechanism, the carriage including a baffle suitable to manipulate a flow of air through the slot; and
   driving the carriage away from the slot opening and orienting the carriage relative to the electronic components on the printed circuit board using the baffle position pin when the printed circuit board is loaded into the slot such that the baffle of the carriage directs the flow of air over the electronic components.

23. The method of claim 22, further comprising drawing the flow of air through the slot using an exhaust fan.

* * * * *